United States Patent [19]

Jang

[11] Patent Number: 5,303,420
[45] Date of Patent: Apr. 12, 1994

[54] CIRCUIT FOR STABILIZING THE BIAS OF A PAGING RECEIVER WITH POWER SAVING FUNCTIONS

[75] Inventor: Jong-Jin Jang, Suwon, Rep. of Korea

[73] Assignee: SamSung Electronics Co., Ltd., Suwon, Rep. of Korea

[21] Appl. No.: 737,377

[22] Filed: Jul. 29, 1991

[30] Foreign Application Priority Data

Mar. 21, 1991 [KR] Rep. of Korea ............... 1991-4499

[51] Int. Cl.[5] ............................. H04B 1/16
[52] U.S. Cl. .......................... 455/343; 455/214; 455/337
[58] Field of Search .............. 455/38.3, 228, 214, 455/343, 318, 323, 334, 337, 338; 340/825.44; 307/261, 296.1, 296.6

[56] References Cited

U.S. PATENT DOCUMENTS

| | | | |
|---|---|---|---|
| 4,479,261 | 10/1984 | Oda et al. | 455/343 |
| 4,590,618 | 5/1986 | Heath et al. | 455/343 |
| 5,025,251 | 6/1991 | Mittel et al. | 455/343 X |

Primary Examiner—Reinhard J. Eisenzopf
Assistant Examiner—Chi H. Pham
Attorney, Agent, or Firm—Robert E. Bushnell

[57] ABSTRACT

There is disclosed a circuit for stabilizing the bias of a paging receiver. An oscillation control signal of first period is generated at the time when a voltage source is connected to the RF components. An oscillation means generates a signal of the center frequency of a received modulated signal in response to the oscillation control signal. A demodulation means demodulates the signal of the center frequency so as to generate a signal of second voltage that is received by a waveform reshaping means to stabilize the bias into the level of the second voltage. The RF receiver converts the received RF modulated signal into a signal offset by a frequency deviation from the center frequency during second period after the termination of the first period. The demodulation means generates a demodulated signal of first or third voltage according to the logical state of the received modulated signal. The waveform reshaping means compares the received demodulated signal with the bias so as to generate a digital signal of a constant duty ratio.

23 Claims, 12 Drawing Sheets

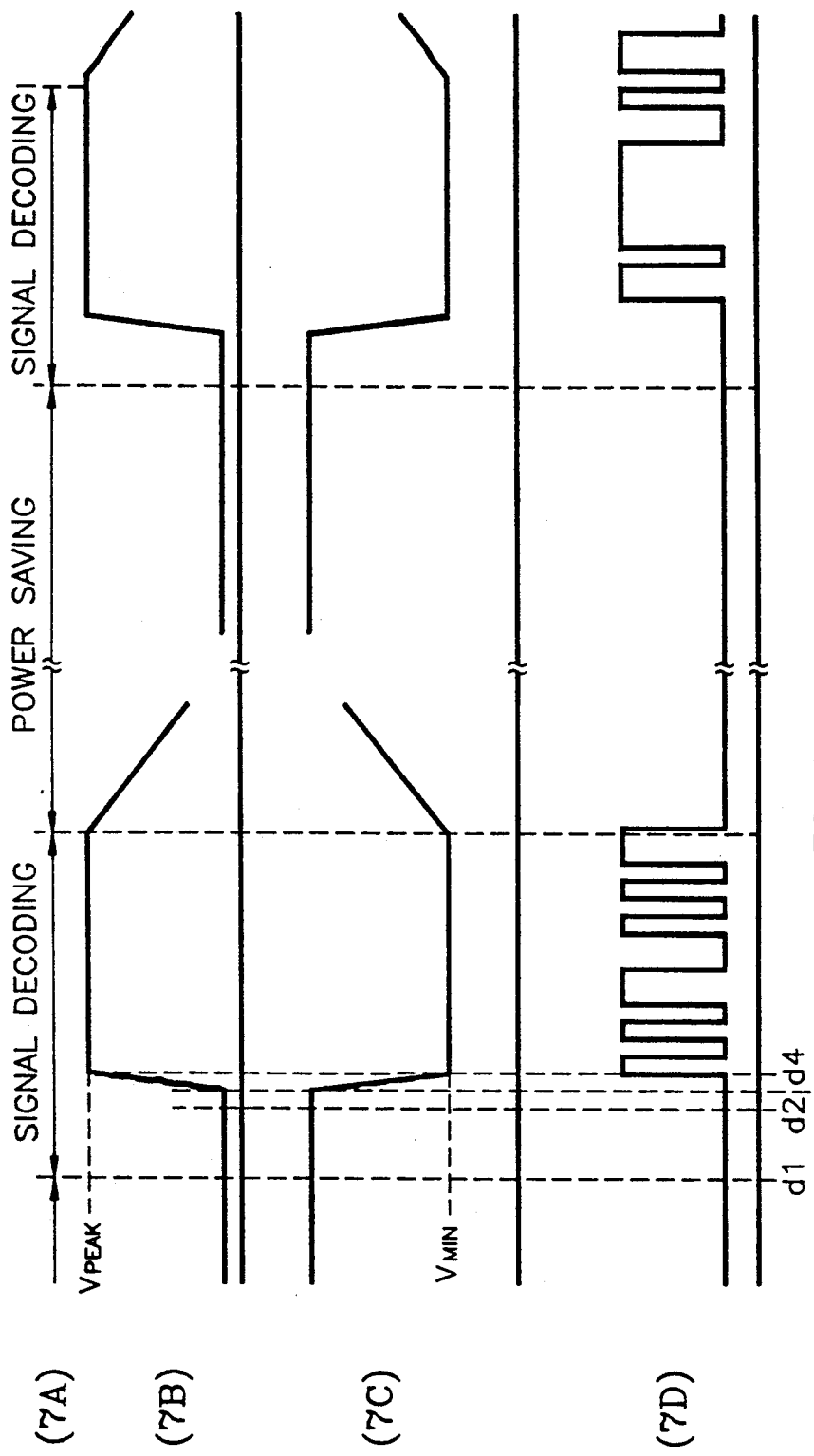

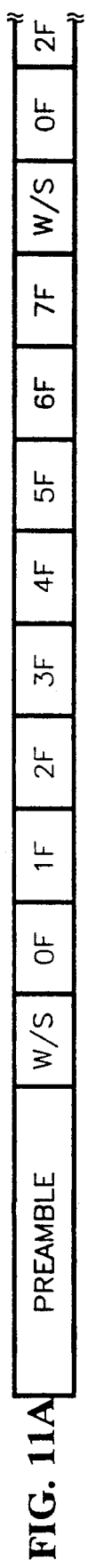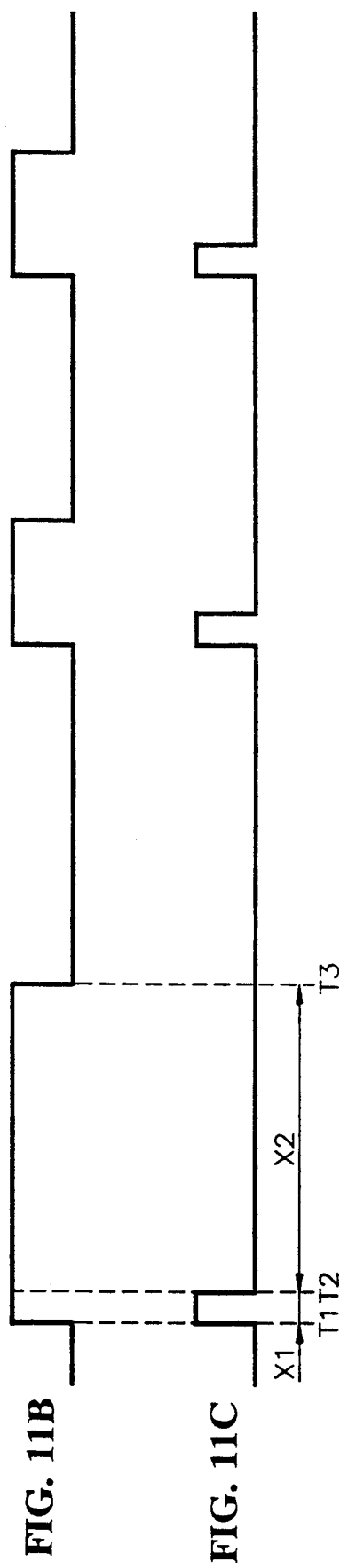
FIG. 11A
FIG. 11B
FIG. 11C

CIRCUIT FOR STABILIZING THE BIAS OF A PAGING RECEIVER WITH POWER SAVING FUNCTIONS

BACKGROUND OF THE INVENTION

The present invention relates to a paging receiver, and more particularly a circuit for receiving a message signal by stabilizing the bias of the paging receiver when periodically controlling a voltage source.

Generally, the paging receiver receives a radio frequency signal (hereinafter referred to as RF signal) transmitted by a paging system, converts the RF signal into an intermediate frequency signal that is demodulated into the original digital data. The demodulated signal is an analog signal shaped into a digital waveform based on a reference signal and applied to a controller. The controller identifies the digital data as self-data, then generates a calling sound signal through the speaker.

Such paging receiver makes use of a small DC battery, and thus power consumption should be minimized so as to lengthen the life span of the battery. To this end, the power supplying of the RF components is controlled so as to reduce the power consumption of the battery. The RF components include a RF receiver, a demodulator and a waveform shaping circuit which are the main cause of most power consumption.

The RF signal transmitted by the paging system is of a given data form. Assuming the RF signal is in the form of POCSAG codes, the signal comprises a preamble part, word sync and frame data. The controller periodically supplies the power to the RF components in order to search for the preamble part (Preamble Search Mode). If the preamble part is detected, the controller keeps on supplying the power and searches for the word sync. Once the word sync is detected, the controller stops supplying the power, thereafter resupplying the power in the self-frame period (Address Search Mode).

However, in such a conventional paging receiver, since all the RF components should be supplied with the power in the preamble search mode, there occurs a large power consumption. The reason is that the power should be supplied to the RF components before receiving the substantial message data, so as to establish a reference signal voltage.

In view of the fact above, there is disclosed an apparatus for saving the power by sequentially supplying the power to the RF components in the U.S. Pat. No. 4,479,261 issued to Japanese Nippon Electric Co., Ltd. on Oct. 23, 1984, as shown in FIGS. 1-3 attached to the present application. In this case, a voltage source control signal with J period through the first and second timers 34 and 35 is provided by the controller 13. The first and second switch circuits 16 and 17 are sequentially switched on in response to the voltage source control signal so as to supply the power of the battery 15 to the waveform reshaping circuit 12 and the receiver 11.

Specifically, if the first timer 34 generates a voltage source control signal as shown in FIG. 3B at a time point D1, the first switch circuit 16 switches on to apply the power to the waveform reshaping circuit 12. Then the output voltage of the low pass filter 21 of the waveform reshaping circuit 12 as showing in FIG. 2 is supplied as the reference signal to the capacitor 24 connected in parallel to the reference terminal (−) of the voltage comparator 25. Thereafter, if the second timer 35 generates a voltage source control signal as shown in FIG. 3C with a J period at a time point D2, the second switch circuit 17 switches on to supply the power to the receiver 11 for enabling conversion and demodulating the RF signal received through the antenna 10. Thus the power supplying of the waveform reshaping circuit 12 and the receiver 11 are controlled by the J period, thereby reducing the power consumption of the receiver 11.

In such controlling of the power, the reference voltage charged in the capacitor 24 at a time point D2 when the receiver 11 is in a reception mode does not effectively serve to determine the logical state of the data output from the receiver 11. The reason is that if the receiver 11 receives the RF signal after the time point D2, the level of the reference voltage is increased by the resistor 23 and the capacitor 24 according to the logical state of the received data. And at the time point D3, the reference voltage is changed to the average voltage of the substantial data.

Thus the charged voltage of the capacitor 24 that serves as the reference signal is delayed by J and K periods after generation of the voltage source control signal, thereby stabilizing the bias voltage. Therefore the data received in the K period suffers a duty change by the unstable reference voltage, so that there may occur data receiving error. In order to prevent such error the reference voltage must be stabilized by sequentially driving the first and second switch circuits 16 and 17 prior to the reception of data. Such stabilizing apparatus is disclosed in the U.S. Pat. No. 4,631,737 issued to the Motorola Company of the U.S.A. on Dec. 23, 1986.

This bias stabilizing apparatus is briefly described with reference to FIGS. 4-7. The RF signal received through the antenna 40 is converted and demodulated in the receiver 41. The demodulated signal output from the receiver 41 has a voltage corresponding to its logical state, and is applied to a comparing terminal of a limiter 44. The demodulated signal is also applied to a peak detector 45 and a valley detector 47. The peak detector holds the peak value of the received data as shown in FIG. 7B, while the valley detector 47 holds the valley value of the received data as shown in FIG. 7C. The peak and valley values are averaged and then applied to the limiter as a reference voltage. Thus, the limiter 44 receives as the reference signal the voltage averaged according to the logical state of the received data, and therefore determines the logical state of the demodulated signal input through the comparing terminal, and then applies the output to the controller.

FIGS. 5 and 6 are respectively the circuits of the peak and valley detectors. When detecting the peak and valley values, there occurs a delayed time caused by each component. As shown in FIG. 7, d1-d3 period is a delayed time period which is representative of a charging time of the capacitor 56. Only by charging the capacitor 56 are operated the transistors 54 and 76 that are respectively of static current sources of the peak and valley detectors 45 and 47. After the time point d3, there is needed the period d3-d4 in order to charge the capacitor 60 with the peak value and to discharge it to the valley value. Consequently it is the time point d4 when the limiter 44 works to determine the data with the substantially stabilized bias.

Such bias stabilizing apparatus, using the average of the peak and valley values of the received data, needs all the RF components (RF receiver, demodulator, waveform reshaping circuit) being provided with the voltage source, thus increasing the power consumption.

SUMMARY OF THE INVENTION

It is an object of the present invention to provide a paging receiver for exactly receiving a message signal by quickly stabilizing the bias.

It is another object of the present invention to provide a circuit for stabilizing the bias of a paging receiver that may supply a signal having the center frequency of an RF modulated signal so as to generate a reference voltage to determine the logical state of the data according to the characteristics of the demodulator.

It is still another object of the present invention to provide a circuit for reducing the power consumption by supplying the power to the RF components in the receiving period after the bias stabilization.

According to the present invention, a circuit for stabilizing the bias of a paging receiver for processing a message signal comprises a voltage source switch circuit for periodically supplying voltage to RF components during first and second periods; a controller for generating an oscillation control signal during the first period; an oscillation circuit for generating a given frequency signal in response to the oscillation control signal; a demodulation circuit for receiving the output signal of the oscillation circuit during the first period to generate a demodulated signal having the voltage of the bias; and a waveform reshaping circuit for receiving the output signal of the demodulation circuit during the first period to stabilize the bias.

The present invention will now be described more specifically with reference to the drawings attached only by way of example.

BRIEF DESCRIPTION OF THE ATTACHED DRAWINGS

FIGS. 7A-7D illustrate the waveforms of FIGS. 4-6;

Figure 9A:
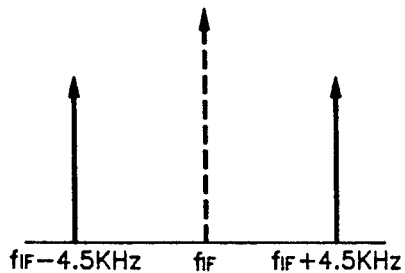
Figure 9B:
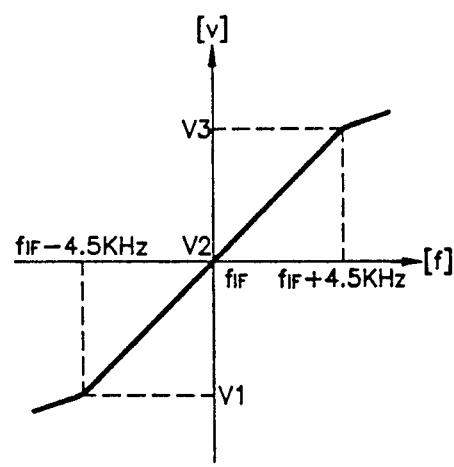
Figure 10:
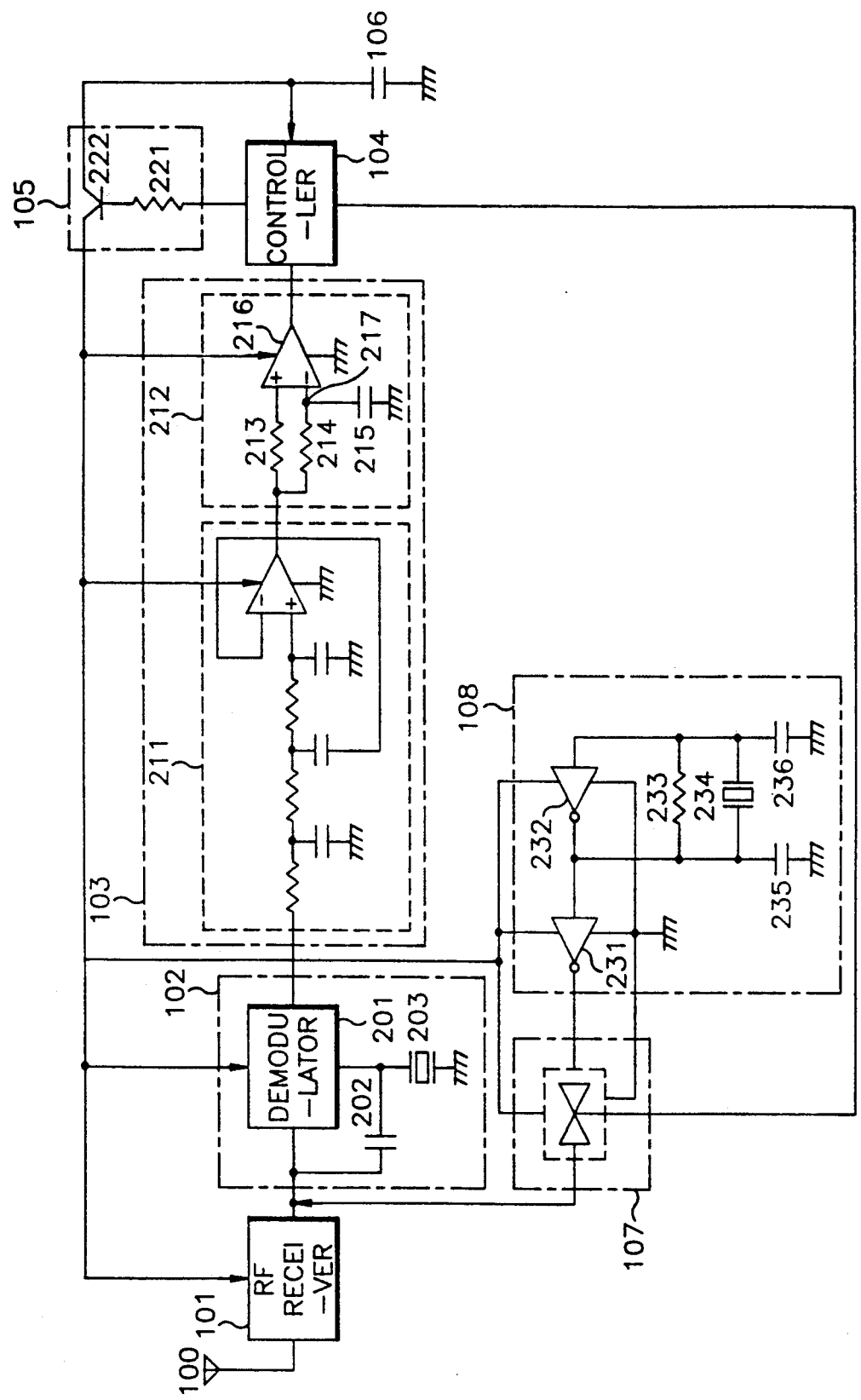
Figure 12:
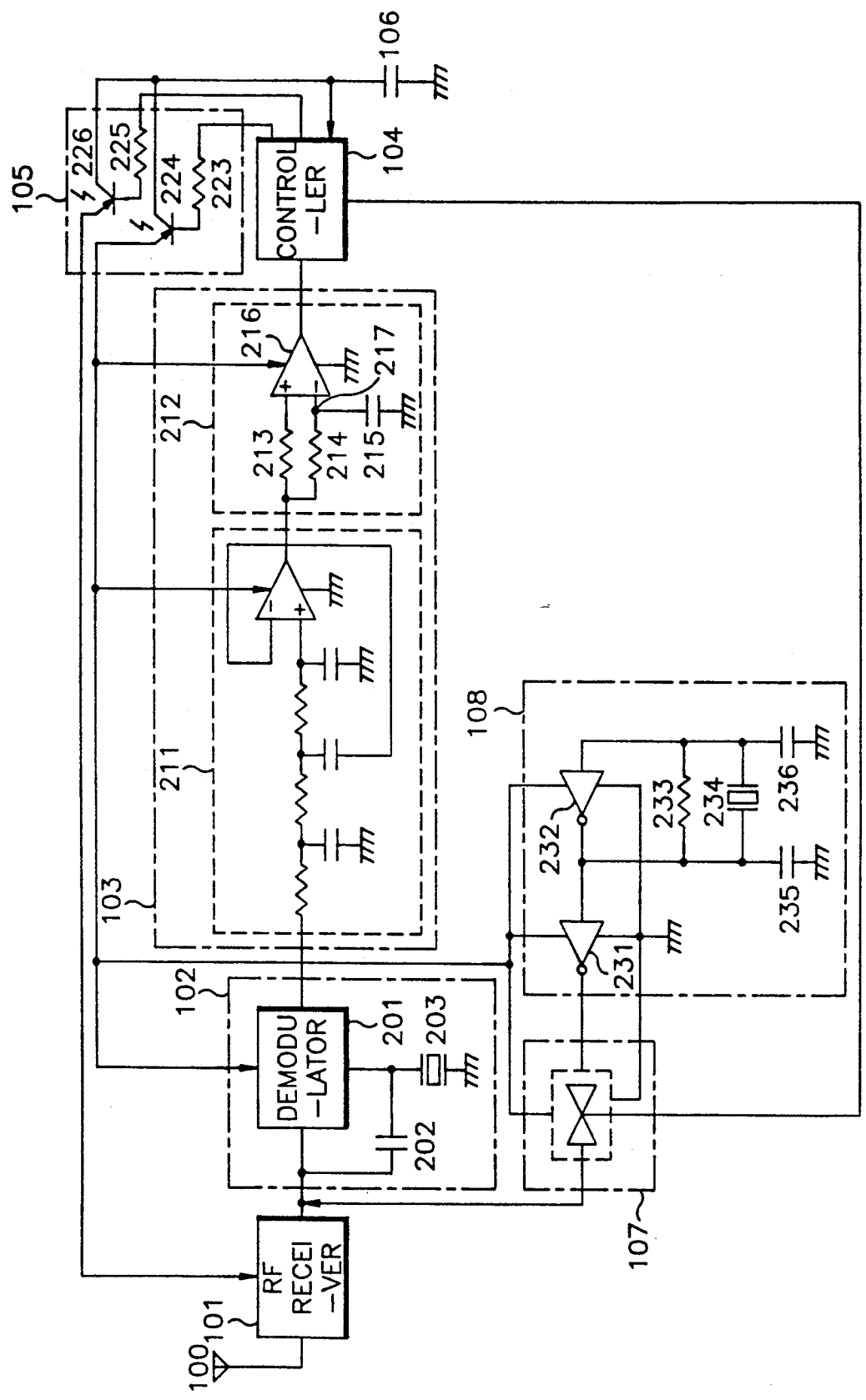

FIGS. 9A-B illustrate the characteristics of the demodulation circuit of the inventive circuit;

FIG. 10 is a circuit diagram of a first embodiment of the present invention;

FIGS. 11A-11C illustrate the waveforms of FIG. 10;

FIG. 12 is a circuit diagram of a second embodiment of the present invention;

FIGS. 13A-13D illustrate the waveforms of FIG. 12; and

Figure 14:
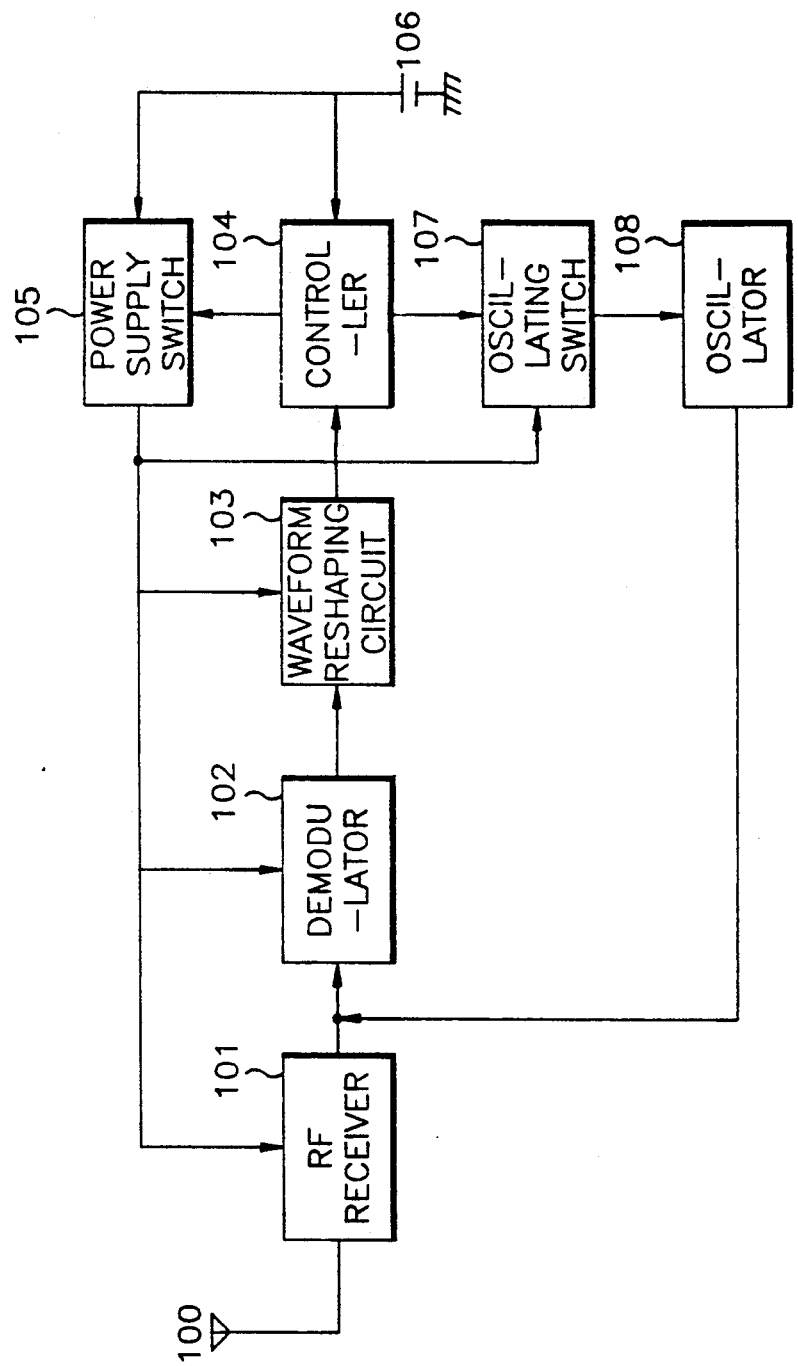

FIG. 14 is a block diagram of a paging receiver according to a further embodiment of the present invention.

DETAILED DESCRIPTION OF CERTAIN PREFERRED EMBODIMENT

Figure 1:
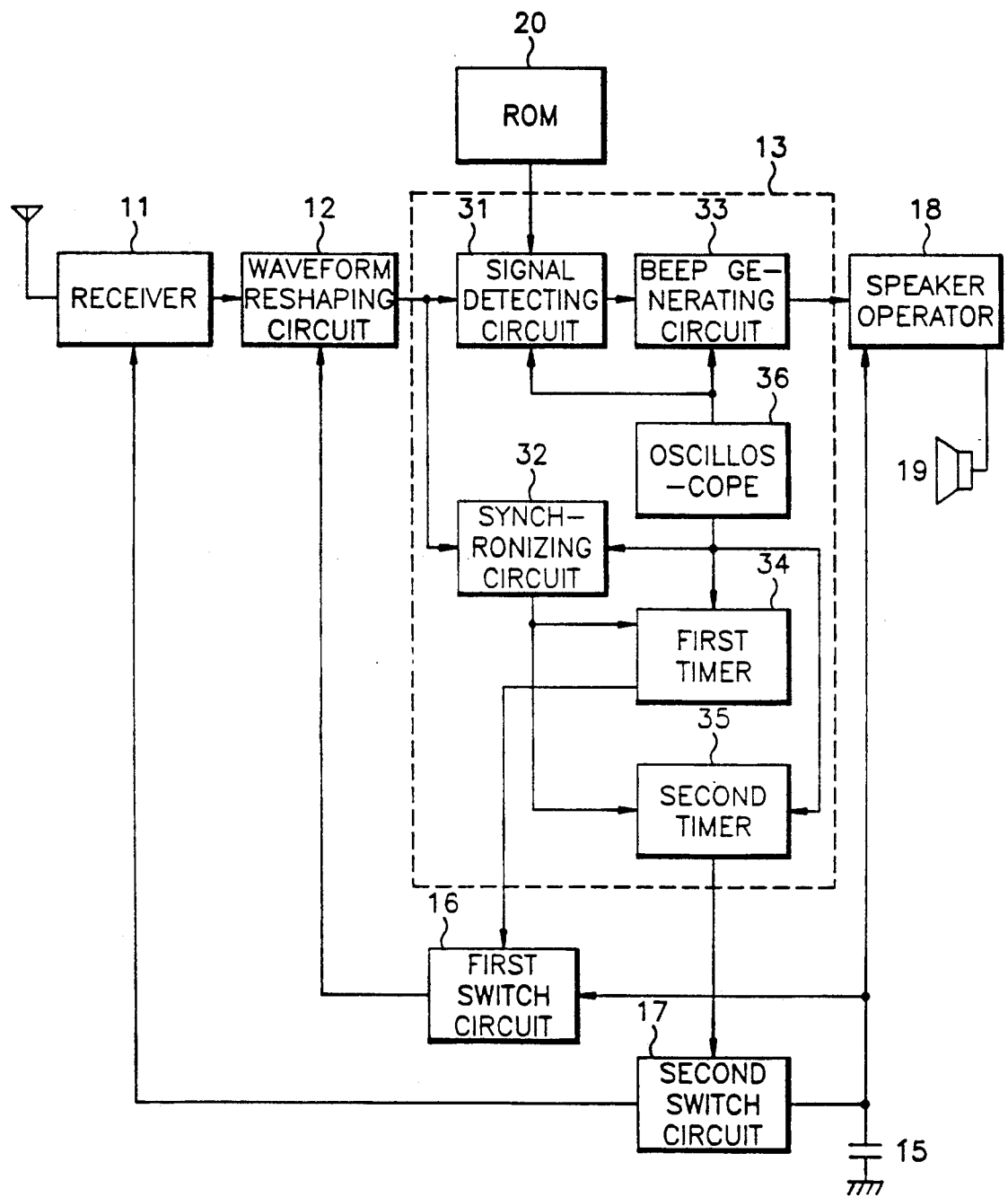
FIG. 1 is a block diagram of a conventional paging receiver.
Figure 2:
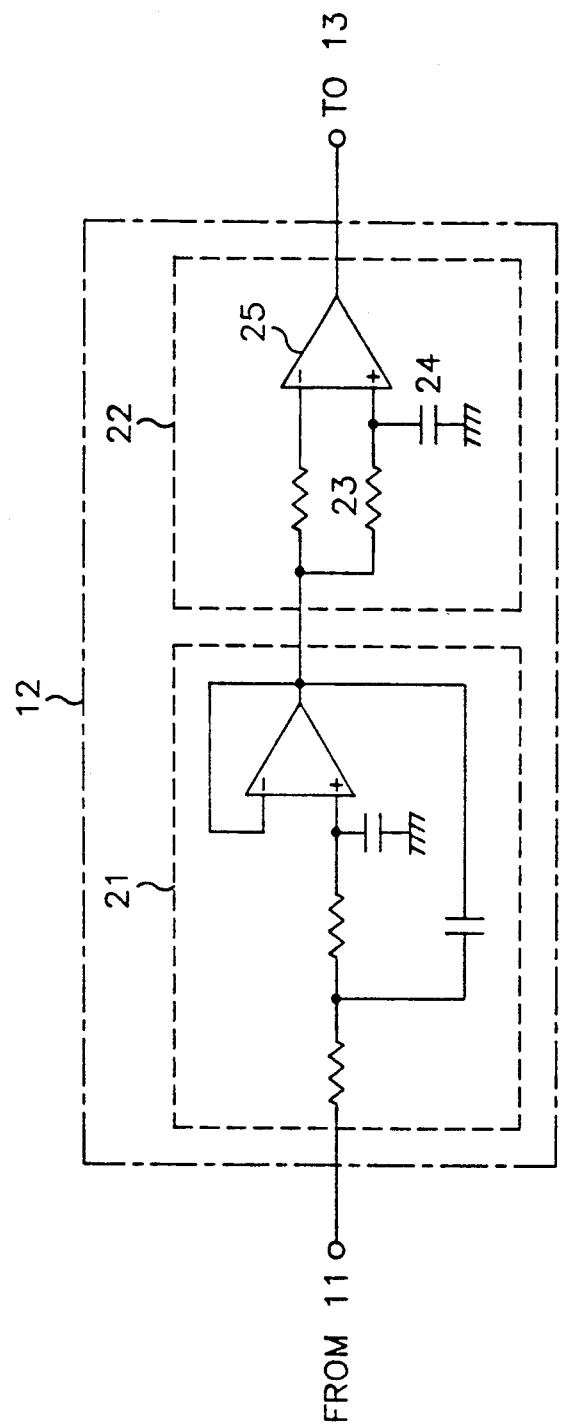
FIG. 2 is a specific circuit diagram or the waveform reshaping circuit of FIG. 1.
Figures 3A, 3B, 3C, 3D:
FIGS. 3A-3D illustrate the waveforms of FIGS. 1 and 2.
Figure 4:
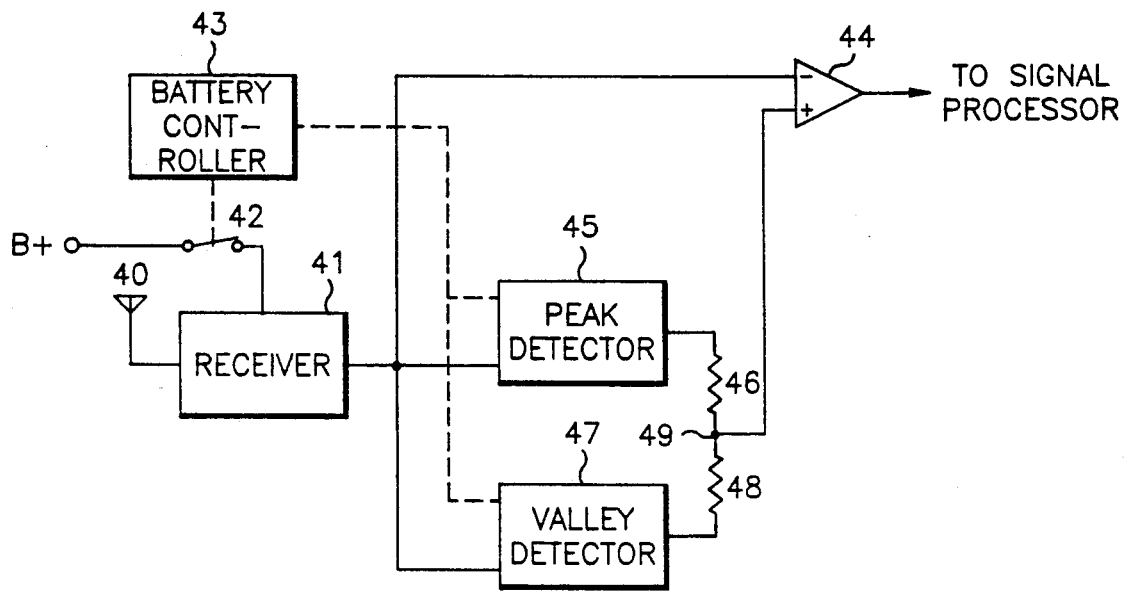
FIG. 4 is a block diagram for illustrating a circuit for stabilizing the bias of a conventional paging receiver.
Figure 6:
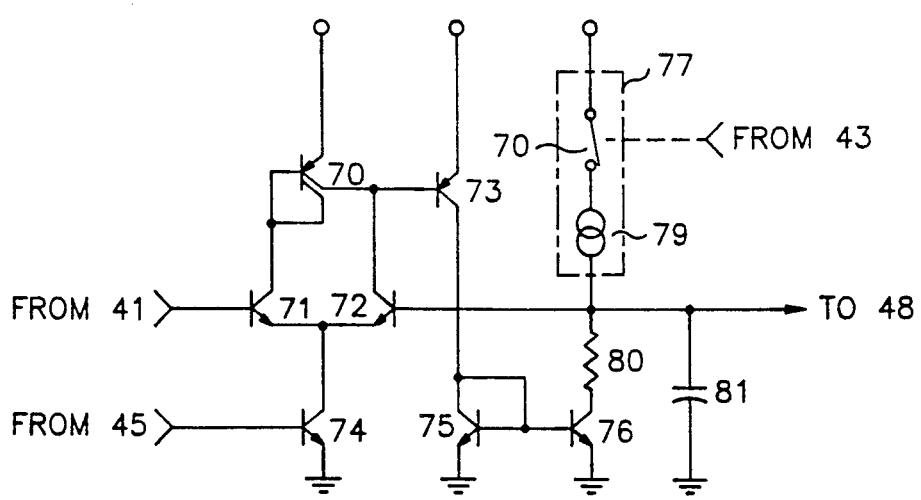
FIG. 6 is a circuit diagram of the valley detector of FIG. 4.
Figure 5:
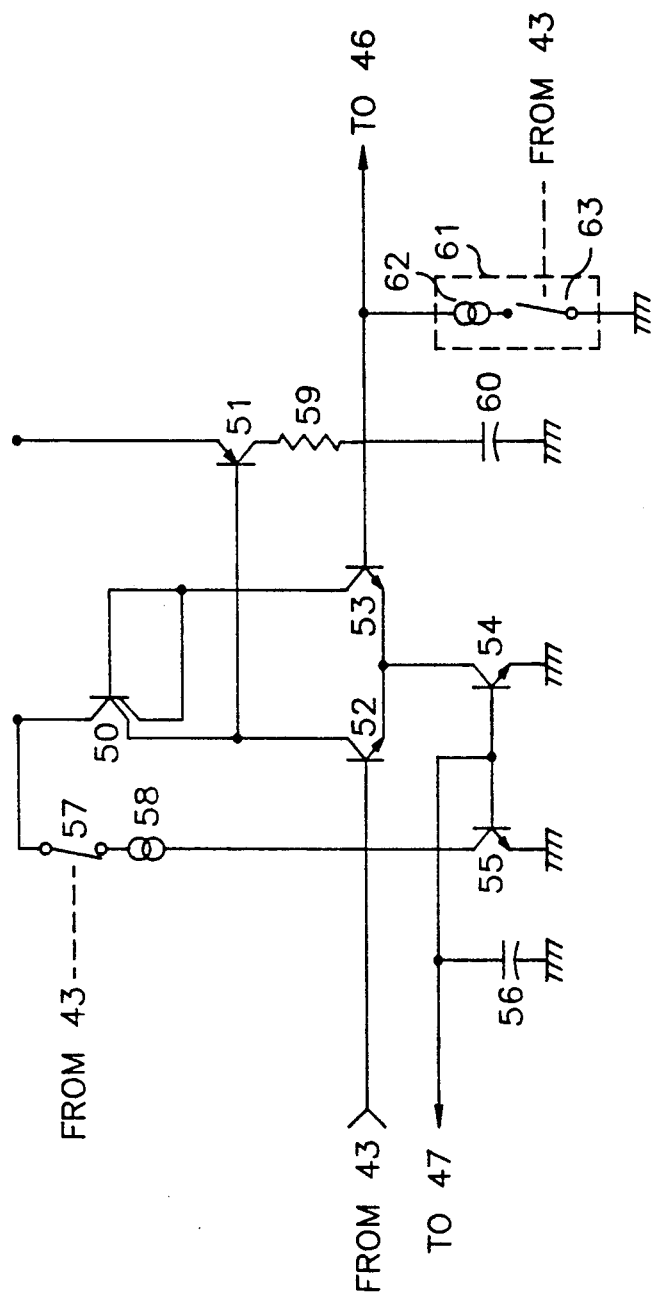
FIG. 5 is a circuit diagram of the peak detector of FIG. 4.
Figure 8:
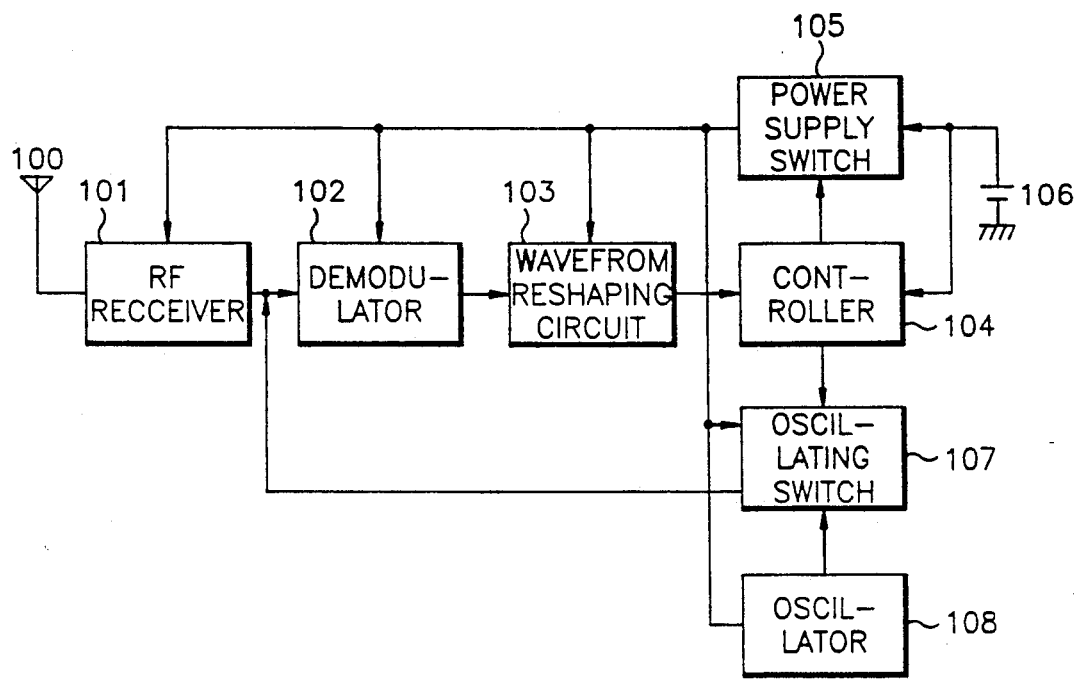
FIG. 8 is a block diagram of the inventive paging receiver.

Referring to FIG. 8, an RF receiver 101 amplifies a RF modulated signal of VHF or UHF band received through an antenna 100, and converts it into an intermediate frequency signal (IF signal) having the logical value of the received data. A demodulation circuit 102 demodulates the output signal received from an oscillation circuit during the bias stabilization period into second voltage V2, and the IF signal output from the RF receiver 101 during the data receiving period into first or third voltage V1 or V3 according to the logical state of the data. A waveform reshaping circuit 103 takes as the stabilized reference bias the demodulated signal of the second voltage V2 output from the demodulation circuit 102 during the bias stabilization period, and shapes the demodulated signal of the first or third voltage V1 or V3 received during the data receiving period into digital data of digital logic in reference to the bias. A controller 104 periodically generates a voltage source control signal, as well as an oscillation control signal during the bias stabilization period, and processes the data output from the waveform reshaping circuit 103 during the data receiving period so as to perform the paging function. A voltage switch circuit 105 is switched on in response to the voltage source control signal so as to connect the voltage source to the RF receiver 101, demodulator 102 and waveform reshaping circuit 103. An oscillation circuit 108 generates an oscillation frequency having a frequency identical to a center frequency of the IF signal converted by the RF receiver 101 signal. An oscillator switch 107 with the input connected to the oscillation circuit 108 is switched on in response to the oscillation control signal so as to generate the oscillation frequency signal to the demodulation circuit 102. Hereinafter, the bias stabilization period is referred to as the first period, and the data receiving period as the second period.

Referring to FIG. 9 for illustrating the characteristics of intermediate frequency band, IF represents the intermediate frequency signal output from the oscillation circuit 108, IF+Δf the data of the logic value "1" output from the RF receiver 101, and IF−Δf the data of the logic value "0" output from the RF receiver 101. Hence, the IF signal has the center frequency of the data signals output from the RF receiver 101.

Referring to FIG. 9B, the demodulation circuit 102 demodulates the oscillation frequency signal into the second voltage V2, IF−Δf into the first voltage V1, and IF+Δf into the third voltage V3.

Referring to FIG. 8, the controller 104 controls the power supplied to the RF receiver 101, demodulation circuit 102, and waveform reshaping circuit 103 so as to prolong the life of the voltage source 106. If the controller 104 periodically generates the voltage source control signal in order to search the RF signal, the voltage source switch circuit 105 is switched on so as to connect the voltage source 106 to the RF components. Besides the controller 104 generates an oscillation control signal during the first period of stabilizing the reference voltage of the waveform reshaping circuit 103. At this time, the RF components are operated as well as the oscillation circuit 108 by the voltage source 106. Then the oscillator switch 107 is switched on in response to the oscillation control signal so as to apply the oscillation frequency signal output from the oscillation circuit 108 to the demodulation circuit 102 during the first period.

The demodulation circuit 102, working as shown in FIG. 9B, demodulates the oscillation frequency signal as shown in FIG. 9A into a signal of the second voltage V2 according to the demodulation characteristics as shown in FIG. 9B. The waveform reshaping circuit 103 receives the output signal of the demodulation circuit 102 so as to stabilize the reference bias signal into the second voltage V2. The bias stabilization period is determined by finding the time during which the reference bias signal of the waveform reshaping circuit 103 finally takes the second voltage V2.

The bias stabilization period completed, the controller 104 stops the generation of the oscillation control signal. Then the oscillator switch 107 is switched off, so as to block the output of the oscillation circuit 108 applied to the demodulation circuit 102.

Thereafter, the RF receiver 101 converts the received RF modulated signal into a IF signal of the IF band. The output signal of the RF receiver 101 is offset from the IF by a frequency deviation of $\Delta f$, having the logic value "1" or "0". The demodulation circuit 102 demodulates the output signal of the RF receiver 101 as shown in FIG. 9B, in which demodulation the signal IF$+\Delta f$ of the logic value "1" generates the third voltage V3, and the signal IF$-\Delta f$ of the logic value "0" the first value V1.

The waveform reshaping circuit holds the bias as the second voltage V2 during the bias stabilization period. Hence, the demodulated signal of the first or third voltage V1 or V3 output from the demodulation circuit 102 during the second period is compared with the bias of the second voltage V2 and shaped into a digital square wave in the waveform reshaping circuit 103, applied to the controller 104. Since the bias of the waveform reshaping circuit 103 has the center value of the demodulated signals having the logical states "1" or "0", the duty ratio of the shaped data may exactly keep 50%.

Two methods may generally be used for the controller 104 to provide the voltage source to RF components. One is to simultaneously connect the voltage source to the RF receiver 101, demodulation circuit 102 and waveform reshaping circuit 103, which is illustrated as a first embodiment in FIG. 10. The other is to firstly connect the voltage source to the demodulation circuit 102 and waveform reshaping circuit 103 during the first period, and then to the RF receiver 101 during the second period, which is illustrated as a second embodiment in FIG. 12.

Referring to FIG. 10, the controller 104 periodically generates the voltage source control signal as shown in FIG. 11B, and also the oscillation control signal having a first period X1 as shown in FIG. 11C. The first period X1 is the bias stabilization period that is determined by finding the time during which the bias of the voltage comparator 216 finally takes the second voltage V2.

Hence, if there are generated the voltage source control signal and oscillation control signal at the time point T1, the transistor 222 is switched on in response to the voltage source control signal as shown in FIG. 11B so as to connect the voltage source to the RF receiver 101, demodulation circuit 102 and waveform reshaping circuit 103 as well as to the oscillation circuit 108.

In addition, if the oscillation switch 107 is switched on in response to the oscillation control signal as shown in FIG. 11C, the oscillation circuit 108 applies the oscillation frequency signal to the demodulation circuit 102. The RF receiver 101 driven by the voltage source control signal as shown in FIG. 11B converts the RF modulated signal received through the antenna 100 into an IF signal of the IF band at the time point T1.

The demodulation circuit 102 receives the output of the oscillation circuit 108 during the first period after the time point T1 and receives the output of the RF receiver 101 during the second period after the time period T2. The demodulation circuit 201 performs demodulation after multiplying the signal that is received through the capacitor 202 and the crystal oscillator 203 a phase delayed by 90°, and the oscillation frequency signal output from the oscillation circuit 108 (differential amplifying).

Thus the demodulation circuit 102 demodulates the oscillation frequency signal into a demodulated signal of the second voltage V2, which signal is rectified through the low pass filter to the second voltage V2 supplied to the resistor 214 and capacitor 215. Hence the voltage of the node 217 begins to increase, and serves as the bias of the comparator 216. As a result, the reference input terminal of the waveform reshaping circuit 103 is biased with the second voltage source V2 prior to the second period of data receiving.

At the first period X1 of bias stabilization, since the demodulation circuit 102 demodulates the oscillation frequency signal output from the oscillation circuit 108 into a demodulated signal of the second voltage V2, the node 217 of the reference input terminal of the waveform reshaping circuit 103 is promptly charged with the second voltage V2. If the time constant of the resistor 214 and capacitor 215 is obtained, there may be determined the time during which the node 217 is biased with the second voltage V2. The controller 104 generates the oscillation control signal during the determined time, and the period of the oscillation control signal is the bias stabilization period X1.

The controller 104 switches off the oscillation control signal at the time point T2, when the bias stabilization period is completed, as shown in FIG. 11C. Then the oscillator switch 107 is off so as to block the output of the oscillation circuit 108 applied the demodulation circuit 102. Then the output of the RF receiver 101 is applied to the demodulation circuit 102. The RF receiver 101 converts the received RF modulated signal into an IF signal of the IF band, so that the output signal of the RF receiver is offset from the IF by a frequency deviation $\Delta f$ according to the logical state thereof, i.e. "1" or "0" as shown in FIG. 9A.

Consequently, the demodulation circuit 102 generates a demodulated signal of the first or third voltage V1 or V3 according to the logical state of the received data. The demodulated signal is rectified through the low pass filter 211, applied to the voltage comparator 216. The voltage comparator 216 compares the demodulated signal of the first or third voltage V1 or V3 with the bias of the second voltage V2 already established in the node 217 so as to generate a digital data signal of a constant duty ratio during the second period X2 of data receiving. This operation is only kept on in response to the voltage source control signal output from the controller 104 during the self-frame data receiving period X2.

Hence, there are simultaneously generated the voltage source control signal and oscillation control signal at the time point T1 for periodically providing the voltage source, as shown in FIGS. 11B and 11C. In this case, since the first period X1 of bias stabilization is the time for the node 217 to finally take the second voltage V2, the time point T1 must precedes the data receiving period by the bias stabilization period X1.

Since the oscillation control signal is off at the time point T2 of data receiving as shown in FIG. 11C, the demodulation circuit 102 demodulates the received RF modulated signal into a signal having the logical level of the original data, which is shaped by the waveform reshaping circuit 103 into a digital signal with a constant duty ratio based on the stabilized bias signal. The self-data receiving period for the operation being terminated, the voltage source control signal becomes off to reduce the power consumption.

Figures 13A, 13B, 13C, 13D:
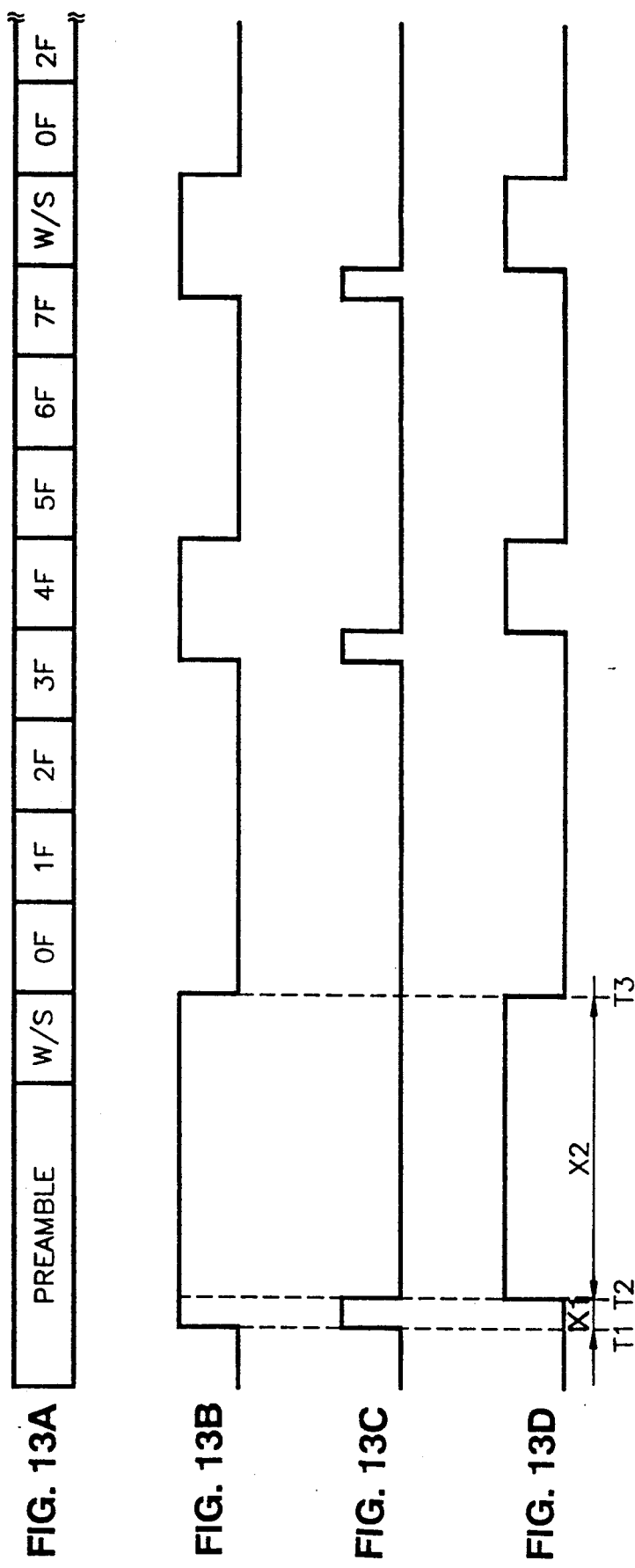

With reference to FIG. 12 will be described the second embodiment of the present invention. In the above first embodiment of the present invention, the controller 104 generates the voltage source control signal so as to simultaneously connect the voltage source to all the RF components. Meanwhile, the bias stabilization period X1 is established prior to the time point T2 of self-data receiving, and therefore the RF receiver 101 unnecessarily consumes the power during the bias stabilization period X1. Namely, the RF receiver 101 consumes large power in order to amplify a small RF modulated signal converted into the IF signal. However, in the second embodiment of FIG. 12, the RF receiver 101 is not connected to the voltage source during the first period X1 of bias stabilization that is achieved by the output of the oscillation circuit 108. Namely, the first voltage source control signal and oscillation control signal are generated at the time point T1 as shown in FIGS. 13B and 13C. Then, the voltage source 106 is connected to the demodulation circuit 102, waveform reshaping circuit 103 and oscillation circuit 108, and the oscillator switch 107 is switched on. At this time, since the voltage source is not connected to the RF receiver 101, the demodulation circuit 102 demodulates the IF signal output from the oscillation circuit 108 into a signal of the second voltage V2. Thus the node 207 for the reference signal is charged with the demodulated signal of the second voltage V2 during the first period X1.

The first period X1 of bias stabilization being terminated, the controller 104 turns off the oscillation control signal at the time point T2 as shown in FIG. 13C, and simultaneously turns on the second voltage source control signal as shown in FIG. 13D. At this time, the first voltage source control signal is kept on as shown in FIG. 13B. Hence, the transistor is turned on to connect the voltage source to the RF receiver 101 from the time point T2. Thus the RF receiver 101 converts the received RF modulated signal into a signal of the IF band. The demodulation circuit 102 demodulates the signal of the IF band into a signal of the first or third voltage V1 or V3 according to the logical state thereof. The waveform reshaping circuit 103 compares the demodulated signal of the first or third voltage V1 or V3 of the demodulation circuit 102 with the bias already stabilized into the second voltage V2 during the first period X1, so as to generate a digital signal having the duty ratio of 50% according to the logical state of the demodulated signal.

The RF receiver 101 converts the RF modulated signal of UHF or VHF band into a signal of the IF band offset by 4.5 KHz from the center frequency 455 KHz according to the logical state thereof. Namely, the modulated signal of the logical state "1" output from the RF receiver 101 has the frequency of 455 KHz+4.5 KHz, while the modulated signal of the logical state "0" has the frequency of 455 KHz-4.5 KHz. Meanwhile, the oscillation circuit 108 generates the oscillation frequency signal of 455 KHz that is the center frequency of the IF band signal output from the RF receiver 101. In this case, there may be used CSB 455J (ceramic resonator of the Murata Company) as the oscillator 234, and TC 4S69F of the Toshiba Company as the inverters 231, 232. The capacitors 235 and 236 may have the capacitance of 100 PF, and the resistor 233 may be of 1MΩ. The oscillator switch 107 may be an analog switch with + and − polarities, for which TC4S66F of the Toshiba Company may be used.

Referring to FIG. 14 for illustrating a further embodiment of the present invention, the output of the voltage source switch circuit 105 is connected to the input of the oscillator switch 107 whose output is connected to the voltage source input of the oscillation circuit 108 whose output is connected to the input of the demodulation circuit 102. The other parts have the same construction as those of FIG. 8. The controller 104 simultaneously generates the voltage source control signal and oscillation control signal during the first period X1 of bias stabilization. Then the voltage source switch circuit 105 is turned on so as to connect the voltage source 106 to the RF components and to the input of the oscillator switch 107. The oscillator switch 107 receives the oscillation control signal through the control terminal so as to connect the voltage source to the voltage source input of the oscillation circuit 108. Then the oscillation circuit 108 generates the IF signal to the demodulation circuit 102. The demodulation circuit 102 demodulates the output signal of the oscillation circuit 108 into a signal of the second voltage V2 applied to the waveform reshaping circuit 103 to stabilize the bias into the level of the second voltage V2.

The first period X1 being terminated, the controller 104 turns off the oscillation control signal. Then the oscillation switch 107 is switched off, so that the oscillation circuit 108 is disconnected from the voltage source stopping the oscillation. Then the demodulation circuit 102 demodulates the modulated signal of the IF band output from the RF receiver 101 during the second period X2. The waveform reshaping circuit 103 compares the demodulated signal with the bias already established so as to generate a digital signal.

Hence, the oscillation circuit 108 is only supplied with the power during the first period X1, and therefore does not perform unnecessary oscillation, thus saving the power.

Of course, the bias stabilization circuit of FIG. 14 may also comprise the circuit of the first embodiment wherein the voltage source is simultaneously connected to the RF receiver 101, demodulation circuit 102 and waveform reshaping circuit 103, or the circuit of the second embodiment wherein the voltage source is firstly connected to the demodulation circuit 102 and waveform reshaping circuit 103, and then secondly to the RF receiver 101 during the second period X2. Moreover, in the embodiment of FIG. 14, the oscillator switch 107 controls the path of the voltage source, and therefore may consist of a conventional switching element instead of an analog switch.

What is claimed is:

1. A circuit for stabilizing the bias of a paging receiver for processing a message signal, comprising:
    voltage source switch means for periodically supplying a voltage from a voltage terminal during first and second periods;

controller means connected to said voltage terminal, for generating an oscillation control signal during said first period;

oscillator means responsive to the supplied voltage, for generating an oscillation frequency signal in response to said oscillation control signal;

demodulation means responsive to the supplied voltage, for receiving the oscillation frequency signal of said oscillator means during said first period to generate a first demodulated signal having a voltage of said bias; and waveform reshaping means responsive to the supplied voltage, for receiving the first demodulated signal of said demodulation means during said first period to stabilize said bias.

2. The circuit for stabilizing the bias of a paging receiver for processing a message signal as claimed in claim 1, wherein said oscillator means comprises:

a crystal oscillator for generating said oscillation frequency signal having a frequency substantially identical to a center frequency of a RF signal received during said second period; said crystal oscillator being provided with the supplied voltage from said voltage source via said voltage source switch means; and a switch interposed between said crystal oscillator and said demodulation means for enabling transmission of the oscillation frequency signal from said crystal oscillator to said demodulation means in dependence upon reception of said oscillation control signal during said first period.

3. The circuit for stabilizing the bias of a paging receiver for processing a message signal as claimed in claim 2, wherein said demodulation means demodulates the oscillation frequency signal from said oscillator means so as to produce the first demodulated signal of said bias during said first period, said bias having an intermediate voltage of said message signal, and produces a second demodulated signal according to logic states of the RF signal received during said second period.

4. The circuit for stabilizing the bias of a paging receiver for processing a message signal as claimed in claim 3, wherein said waveform reshaping means comprises a differential amplifier having a message signal terminal coupled to receive said second demodulated signal and a reference signal terminal coupled to receive said first demodulated signal, for stabilizing the bias of said first demodulated signal from said demodulation means during said first period and for generating digital data in reference to said bias of said first demodulated signal in dependence upon reception of said second demodulated signal from said demodulation means through said message signal terminal during said second period.

5. The circuit for stabilizing the bias of a paging receiver for processing a message signal as claimed in claim 1, wherein said oscillator means comprises:

a crystal oscillator for providing said oscillation frequency signal to said demodulation means during said first period; and a switch for enabling transmission of said oscillation frequency signal from said crystal oscillator to said demodulation means in response to said oscillation control signal.

6. The circuit for stabilizing the bias of a paging receiver for processing a message signal as claimed in claim 5, wherein said demodulation means demodulates the oscillation frequency signal from said oscillator means so as to produce said first demodulated signal having said bias during said first period, and generates a second demodulated signal according to logic state of a RF signal received during said second period.

7. The circuit for stabilizing the bias of a paging receiver for processing a message signal as claimed in claim 6, wherein said waveform reshaping means comprises a differential amplifier having a message signal terminal coupled to receive said second demodulated signal and a reference signal terminal coupled to receive said first demodulated signal, for stabilizing the bias of said first demodulated signal during said first period and for generating a digital data in reference to said bias of said first demodulated signal in dependence upon said second demodulated signal from said demodulation means through said message signal terminal during said second period.

8. A circuit for stabilizing the bias of a paging receiver for processing a message signal, comprising:

controller means for generating a voltage source control signal during first and second period, and an oscillation control signal during the first period;

voltage source switch means for supply power from a voltage source in response to said voltage source control signal;

oscillator means for generating an oscillation frequency signal in response to said oscillation control signal;

RF receiver means for converting a RF modulated signal into an intermediate frequency signal;

demodulation means for demodulating the oscillation frequency signal so as to produce a first demodulated signal having a reference for said bias, and for generating a second demodulated signal in dependence upon said intermediate frequency signal received during said second period; and waveform reshaping means for stabilizing said bias upon reception of said first demodulated signal during said first period and for identifying logical stages of said second demodulated signal produced during said second period in reference to said bias to generate a digital signal.

9. The circuit for stabilizing the bias of a paging receiver for processing a message signal as claimed in claim 8, wherein said oscillation means comprises:

an oscillator for generating said oscillation frequency signal having a frequency substantially identical to a center frequency of said intermediate frequency signal, said oscillator being connected to said voltage source via said voltage source switch means; and an oscillator switch for connecting said demodulation means and said oscillator in response to said oscillation control signal during said first period.

10. The circuit for stabilizing the bias of a paging receiver for processing a message signal as claimed in claim 9, wherein said demodulation means demodulates the oscillation frequency signal produces by said oscillator means during said first period to produce said first demodulated signal having said reference voltage of a second voltage, and generates said second demodulated signal in dependence upon said intermediate signal from said RF receiver means during said second period, said second demodulated signal having one of first and third voltages according to said logical states.

11. The circuit for stabilizing the bias of a paging receiver for processing a message signal as claimed in claim 10, wherein said waveform reshaping means comprises a differential amplifier having a message signal terminal coupled to receive said second demodulated signal and a reference signal terminal coupled to receive said first demodulated signal for stabilizing the bias of said first demodulated signal received to said second voltage during said first period, and for generating digital data based on the logical states of said second demodulated signal having one of said first and third voltage received during said second period.

12. The circuit for stabilizing the bias of a paging receiver for processing a message signal as claimed in claim 8, wherein said oscillator means comprises:
an oscillator for generating said oscillation frequency signal having a frequency substantially identical to a center frequency of said intermediate frequency signal during said first period; and
an oscillator switch for connecting said oscillator and said demodulation means in response to said oscillation control signal.

13. The circuit for stabilizing the bias of a paging receiver for processing a message signal as claimed in claim 12, wherein said demodulation means demodulates said oscillation frequency signal produced by said oscillator means during said first period to produce said first demodulated signal having a second voltage of a reference voltage, and demodulates said intermediate frequency signal produced by said RF receiver means during said second period to produce said second demodulated signal having one of first and third voltages according to said logical states.

14. The circuit for stabilizing the bias of a paging receiver for processing a message signal as claimed in claim 13, wherein said waveform reshaping means comprises a differential amplifier having a message signal terminal coupled to receive said second demodulated signal and a reference signal terminal coupled to receive said first demodulated signal, for stabilizing the bias of said first demodulated signal having said second voltage received during said first period, and for generating digital data according to logic states of said second demodulated signal having one of said first and third voltages received during said second period.

15. A circuit for stabilizing the bias of a paging receiver for processing a message signal, comprising:
controller means for generating a first voltage source control signal and an oscillation control signal during a first period, and said first voltage source control signal and a second voltage source control signal during a second period;
voltage source switch means consisting of first and second voltage source switches for supplying power from a voltage source in response to said first and second voltage source control signals;
oscillation means for generating an oscillation frequency signal in response to said oscillation control signal;
RF receiver means connected to said second voltage source switch, for converting an RF modulated signal into an intermediate frequency signal;
demodulation means connected to said first voltage source switch, for demodulating the output signal of said oscillator means produced during said first period so as to produce a first demodulated signal having a reference voltage for said bias, and for producing a second demodulated signal according to logical states of said intermediate frequency signal produced by said RF receiver means during said second period; and
waveform reshaping means connected to said first voltage source switch, for stabilizing said bias upon reception of said first demodulated signal from said demodulation means during said first period and for identifying the logical states of the second demodulated signal produced during said second period in reference to said bias to produce digital data.

16. The circuit for stabilizing the bias of a paging receiver for processing a message signal as claimed in claim 15, wherein said oscillator means comprises:
an oscillator for generating said oscillation frequency signal having a frequency substantially identical to a center frequency of said intermediate frequency signal; and
an oscillator switch for connecting said oscillator and said demodulation means in response to said oscillation control signal.

17. The circuit for stabilizing the bias of a paging receiver for processing a message signal as claimed in claim 16, wherein said demodulation means demodulates said oscillation frequency signal produced by said oscillator during said first period to produce said first demodulated signal having a reference voltage as a second voltage, and demodulates said intermediate frequency signal produced by said RF receiver means during said second period to produce said second demodulated signal having one of first and third voltages according to said logical states.

18. The circuit for stabilizing the bias of a paging receiver for processing a message signal as claimed in claim 17, wherein said waveform reshaping means comprises a differential amplifier having a message signal terminal coupled to receive said second demodulated signal and a reference signal terminal coupled to receive said first demodulated signal, for stabilizing the bias of said second voltage of said first demodulated signal received during said first period, and for generating said digital data based on the logical states of said second demodulated signal having one of said first and third voltages received during said second period.

19. The circuit for stabilizing the bias of a paging receiver for processing a message signal as claimed in claim 15, wherein said oscillator means comprises:
an oscillator for generating said oscillation frequency signal having a frequency substantially identical to a center frequency of said intermediate signal during said first period; and
an oscillator switch for connecting said oscillator and said demodulation means in response to said oscillation control signal.

20. The circuit for stabilizing the bias of a paging receiver for processing a message signal as claimed in claim 19, wherein said demodulation means demodulates said oscillation frequency signal produces by said oscillator means during said first period into a second voltage of a reference voltage, and demodulates said intermediate frequency signal produced by said RF receiver means during said second period into one of first and third voltages according to said logical states.

21. The circuit for stabilizing the bias of a paging receiver for processing a message signal as claimed in claim 20, wherein said waveform reshaping means comprises a differential amplifier having a message signal terminal coupled to receive said second demodulated signal and a reference signal terminal coupled to receive said first demodulated signal, for stabilizing the bias of said second voltage of said first demodulate signal received during said first period, and for generating said digital data based on the logical states of said second demodulated signal having one of said first and third voltages received during said second period.

22. A circuit for stabilizing the bias of a paging receiver, comprising:

receiver means for receiving a radio-frequency signal via an antenna and converting said radio-frequency signal into an intermediate-frequency signal;

oscillator means for generating an oscillation-frequency signal having a frequency substantially identical to a center frequency of said intermediate-frequency signal;

generator means for generating digital data having a constant duty ratio by enabling demodulation and digitization of said intermediate-frequency signal during a data reception period upon utilization of said oscillation-frequency signal as a bias reference voltage during a bias stabilization period immediately preceding to said data reception period; and means for selectively supplying power from a voltage source to enable operation of said oscillator means only during said bias stabilization period while enabling operation of said receiver means only during said data reception period and said generator means during both of said bias stabilization period and said data reception period.

23. The circuit for stabilizing the bias of a paging receiver as claimed in claim 22, wherein said generator means comprises:

demodulation means for demodulating said oscillation-frequency signal during said bias stabilization period to produce a first demodulated signal having said bias reference voltage and for demodulating said intermediate-frequency signal to produce a second demodulated signal during said data reception period; and waveform reshaping means for generating said digital data from said second demodulated signal during said data reception period after stabilizing said second demodulated signal with said bias reference voltage of said first demodulated signal during said bias stabilization period.

* * * * *

UNITED STATES PATENT AND TRADEMARK OFFICE
CERTIFICATE OF CORRECTION

PATENT NO. : 5,303,420
DATED : April 12, 1994
INVENTOR(S) : Jong-Jin JANG

It is certified that error appears in the above-indentified patent and that said Letters Patent is hereby corrected as shown below:

Column 4, line 10, after "circuit" insert --108--.

IN THE CLAIMS

Column 10,

Claim 8, line 41, change "stages" to --states--.

Column 11,

Claim 11, line 5, after "signal" insert --,--.

Column 12,

Claim 19, line 49, after "intermediate" insert --frequency--.

Claim 20, line 57, change "produces" to --produced--.

Signed and Sealed this

Sixteenth Day of May, 1995

*Attest:*

BRUCE LEHMAN

*Attesting Officer*      *Commissioner of Patents and Trademarks*